(12) United States Patent
Hsieh et al.

(10) Patent No.: US 8,766,740 B2
(45) Date of Patent: Jul. 1, 2014

(54) EQUALIZER FOR LOSS-COMPENSATION OF HIGH-FREQUENCY SIGNALS GENERATED IN TRANSMISSION CHANNELS

(71) Applicant: Hon Hai Precision Industry Co., Ltd., New Taipei (TW)

(72) Inventors: Po-Chuan Hsieh, New Taipei (TW); Ying-Tso Lai, New Taipei (TW); Cheng-Hsien Lee, New Taipei (TW); En-Shuo Chang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/685,942

(22) Filed: Nov. 27, 2012

(65) Prior Publication Data
US 2013/0272363 A1    Oct. 17, 2013

(30) Foreign Application Priority Data

Apr. 17, 2012    (TW) .............................. 101113679 A

(51) Int. Cl.
*H04B 3/14*    (2006.01)

(52) U.S. Cl.
CPC ........................................ *H04B 3/14* (2013.01)
USPC ........................................................ 333/28 R

(58) Field of Classification Search
USPC ........................................................ 333/28 R
See application file for complete search history.

(56) References Cited

U.S. PATENT DOCUMENTS

2012/0194304 A1 * 8/2012 Muraoka ..................... 333/28 R

* cited by examiner

*Primary Examiner* — Stephen Jones
(74) *Attorney, Agent, or Firm* — Novak Druce Connolly Bove + Quigg LLP

(57) ABSTRACT

An equalizer for compensating transmission losses of electronic communication signals includes a circuit board and a compensation module. The compensation module includes a pair of input pins, a pair of output pins, and at least two resistors. When a signal transmitted by the circuit board is received by the input pins, a first portion of the signal is directly output from the output pins, a second portion of the signal is reflected by the first resistor and transmitted back to the output pins to output, and a third portion of the signal is reflected by the second resistor and transmitted back to the output pins to output, such that output of the equalizer applies two stages of compensation.

17 Claims, 5 Drawing Sheets

US 8,766,740 B2

EQUALIZER FOR LOSS-COMPENSATION OF HIGH-FREQUENCY SIGNALS GENERATED IN TRANSMISSION CHANNELS

BACKGROUND

1. Technical Field

The present disclosure relates to equalizers used in electronic communication, and particularly to an equalizer providing better signal loss-compensation.

2. Description of Related Art

In electronic communication, high-frequency signals (e.g., most digital signals) may be attenuated in transmission channels, that is, may suffer loss or degradation. The transmission loss of high-frequency signals may cause a failure of electronic communication. Equalizers may be used to compensate for the transmission loss of high-frequency signals. However, in a transmission process of a high-frequency signal, a typical equalizer may only be able to compensate for the high-frequency signal once. Thus, the high-frequency signal may be unable to obtain adequate compensation to offset the transmission loss.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the various figures.

DETAILED DESCRIPTION

Figure 1:
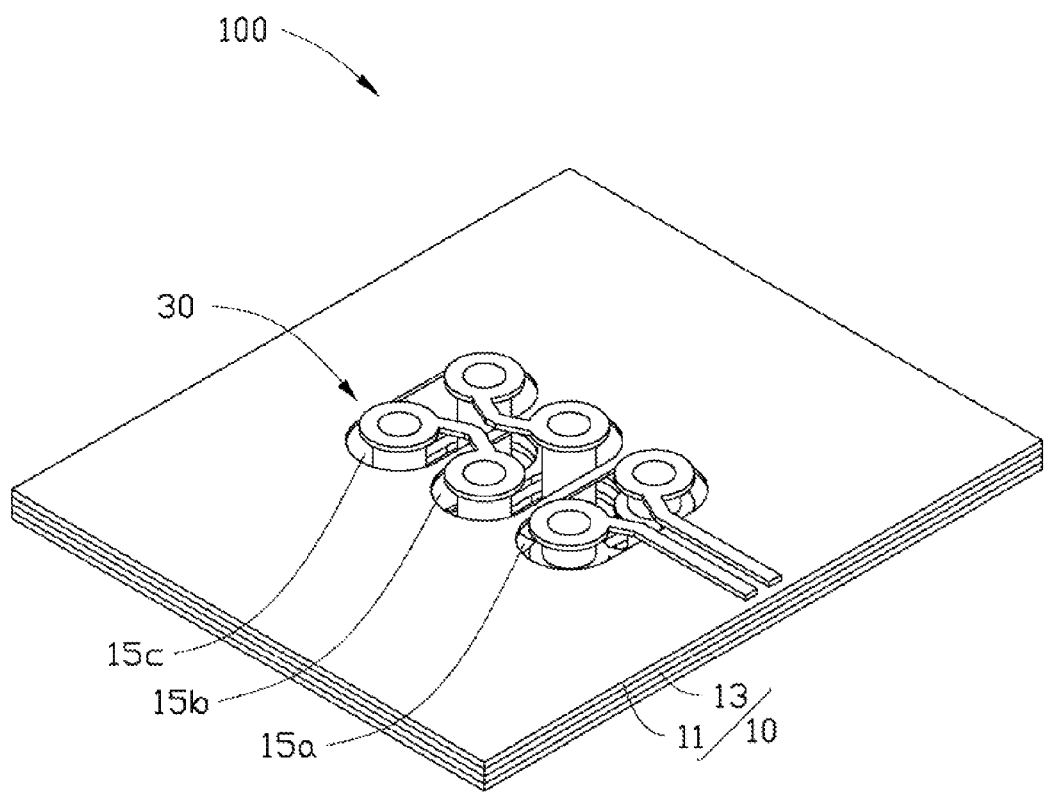
FIG. 1 is a schematic view of an equalizer, according to an exemplary embodiment.

FIG. 1 is a schematic view of an equalizer 100, according to an exemplary embodiment. The equalizer 100 can be used in an electronic device, for example, a personal computer (PC) or a mobile phone, to improve electronic communication quality. When high-frequency signals (e.g., most digital signals) are transmitted in the electronic device, the equalizer 100 can compensate attenuation of the high-frequency signals.

The equalizer 100 includes a circuit board 10 and a compensation module 30 mounted on the circuit board 10. In this embodiment, the circuit board 10 is a multilayer circuit board, and includes at least two signal layers 11 and at least two grounding layers 13. The signal layers 11 and the grounding layers 13 are positioned parallel and alternately, and are assembled together by means such as glue, bolts, or rivets. Electronic communication signals can be transmitted through each of the signal layers 11.

The circuit board 10 defines a plurality of assembly vias to receive the compensation module 30. In this embodiment, the circuit board 10 defines three assembly vias 15a, 15b, and 15c. Each of the assembly vias 15a, 15b, and 15c runs through all of the signal layers 11 and the grounding layers 13, and the compensation module 30 is received in the assembly vias 15a, 15b, and 15c.

Figure 2:
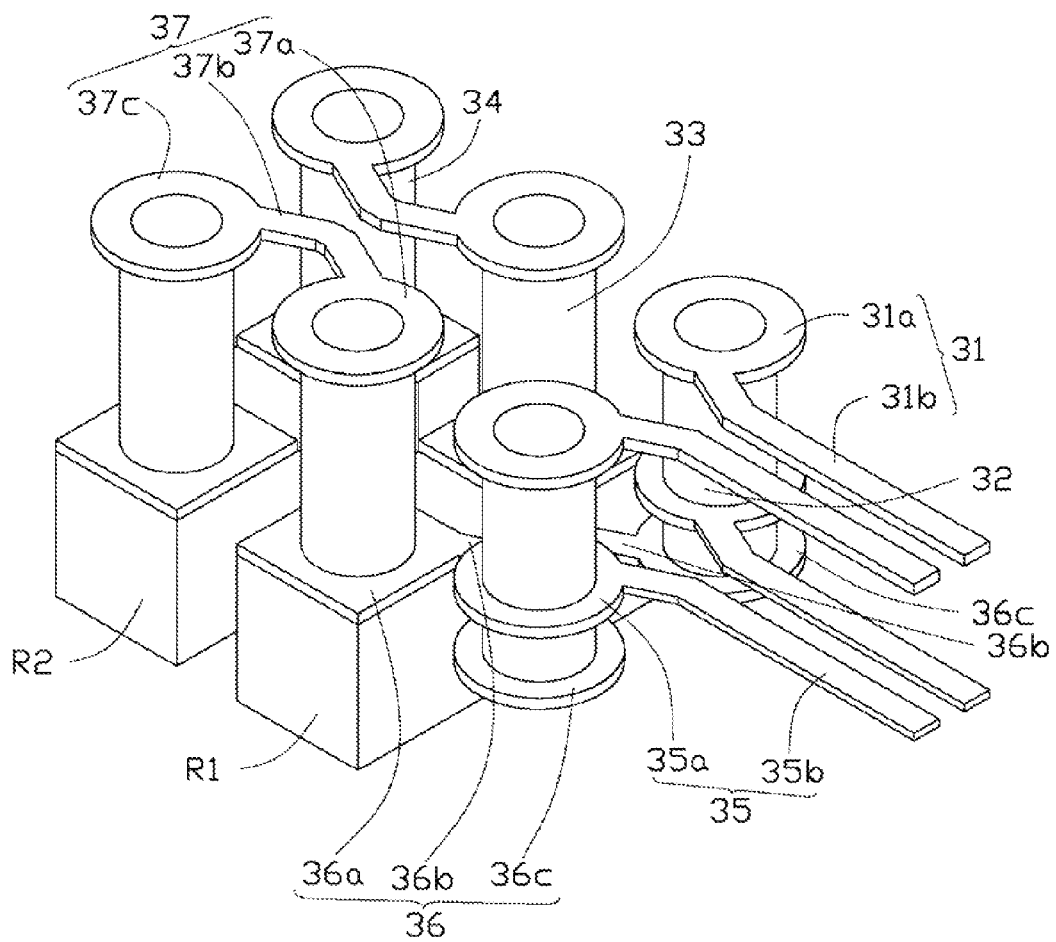
FIG. 2 is a schematic view of a compensation module of the equalizer shown in FIG. 1.

Also referring to FIG. 2, the compensation module 30 includes a pair of input pins 31, a pair of first conducting vias 32, a pair of second conducting vias 33, a pair of third conducting vias 34, a pair of output pins 35, a pair of first connection elements 36, a pair of second connection elements 37, a first resistor R1, and a second resistor R2. The input pins 31, the first conducting vias 32, the second conducting vias 33, the third conducting vias 34, the output pins 35, the first connection elements 36, and the second connection elements 37 are all made of conductive material, such as metal. The first conducting vias 32, the second conducting vias 33, and the third conducting vias 34 are all hollow cylinders. The first conducting vias 32, the second conducting vias 33, and the third conducting vias 34 are all parallel to each other, and are arranged at in two parallel columns. Each of the two columns includes one of the first conducting vias 32, one of the second conducting vias 33, and one of the third conducting vias 34 arranged in that order. Each of the two second conducting vias 33 has a bottom end perpendicularly secured to and electrically connected to the first resistor R1. Each of the two third conducting vias 34 has a bottom end perpendicularly secured to and electrically connected to the second resistor R2.

The input pins 31, the output pins 35, the first connection elements 36, and the second connection elements 37 are all substantially planar sheets. Each of the input pins 31 includes a first circular pad 31a and a first pin section 31b. The first circular pad 31a is a flat loop, and the first pin section 31b is a longitudinal strip. An end of the first pin section 31b is connected to the first circular pad 31a, and the first circular pad 31a and the first pin section 31b are coplanar. The first circular pads 31a of the two input pins 31 are mounted on top ends of the two first conducting vias 32, respectively. The first circular pad 31a of each input pin 31 is secured on the top end of one of the two first conducting vias 32, and contacts the top end of the first conducting via 32 to be electrically connected to the first conducting via 32. Furthermore, a central hole (not labeled) of each first circular pad 31a is aligned with a central hole (not labeled) of one of the two first conducting vias 32. In this embodiment, the two first conducting vias 32 are positioned at the same height, and thus the two input pins 31 are coplanar. The two first pin sections 31b are parallel to each other.

Each of the output pins 35 includes a second circular pad 35a and a second pin section 35b. Similar to the first circular pad 31a and the first pin section 31b, the second circular pad 35a is a flat loop, and the second pin section 35b is a longitudinal strip being coplanar with the second circular pad 35a. An end of the second pin section 35b is connected to the second circular pad 35a, and the second circular pad 35a and the second pin section 35b are coplanar. The second circular pads 35a of the two output pins 35 are coiled on middle portions of the two first conducting vias 32, respectively. The second circular pad 35a of each output pin 35 is secured on the middle portion of one of the two first conducting vias 32, and contacts the middle portion of the first conducting via 32, so as to be electrically connected to the first conducting via 32. The second pin sections 35b of the two output pins 35 extend parallel to each other. In this embodiment, the two output pins 35 are coplanar, and a plane in which the two output pins 35 are positioned is parallel to the plane in which the two input pins 31 are positioned. Furthermore, the two second pin sections 35b extend parallel to the two first pins sections 31b.

Each of the first connection elements 36 includes a retaining pad 36a, a first connection section 36b, and a third circular pad 36c. The retaining pad 36a, the first connection section 36b, and the third circular pad 36c are all planar sheets and are positioned to be coplanar. In this embodiment, the retaining pad 36a is a rectangular sheet, the first connection section 36b is an arc-shaped sheet, and the third circular pad 36c is a flat loop. One end of the first connection section 36b is connected to a corner of the retaining pad 36a, and the other end of the first connection section 36b is connected to the third circular pad 36c. The retaining pads 36a of both the two first connection elements 36 are mounted flatly on the first resistor R1. Bottom ends of both the two second conducting vias 33 are perpendicularly connected to the first resistor R1, and contact the retaining pads 36a of the two first connection elements 36, respectively, so as to be electrically connected to the resistor R1 via the two retaining pads 36a. The third circular pads 36c of the two first connection elements 36 are coiled on bottom ends of the two first conducting vias 32, respectively. Thus, the two second conducting vias 33 are electrically connected to the two first conducting vias 32 via the two first connection elements 36, respectively. Furthermore, in this embodiment, the two first connection elements 36 are coplanar, and a plane in which the two first connection elements 36 is positioned is parallel to the plane in which the two output pins 35 are positioned and to the plane in which the two input pins 31 are positioned.

Each of the second connection elements 37 includes a fourth circular pad 37a, a second connection section 37b, and a fifth circular pad 37c. The fourth circular pad 37a, the second connection section 37b, and fifth circular pad 37c are all planar sheets and are coplanar. In this embodiment, both the fourth circular pad 37a and the fifth circular pad 37c are flat loops, and the second connection section 37b is an arc-shaped sheet. Two ends of the second connection section 37b are respectively connected to the fourth circular pad 37a and the fifth circular pad 37c. The fourth circular pads 37b of the two second connection elements 37 are secured on top ends of the two second conducting vias 33, and contact the top ends of the second conducting via 33, so as to be electrically connected to the second conducting vias 33, respectively. A central hole (not labeled) of each fourth circular pad 37b is aligned with a central hole (not labeled) of one of the two second conducting vias 33. The fifth circular pads 37c of the two second connection elements 37 are secured on top ends of the two third conducting vias 34, and contact the top ends of the third conducting via 34, so as to be electrically connected to the third conducting vias 34, respectively. A central hole (not labeled) of each fifth circular pad 37b is aligned with a central hole (not labeled) of one of the two third conducting vias 34. Thus, the two second conducting vias 33 are electrically connected to the two third conducting vias 34 via the two second connection elements 37, respectively. Furthermore, in this embodiment, the two second connection elements 37 are coplanar with the two input pins 31.

In assembly, the first conducting vias 32 are received in the assembly via 15a, the second conducting vias 33 and the first resistor R1 are received in the assembly via 15b, and the third conducting vias 34 and the second resistor R2 are received in the assembly via 15c. Both the two first pin sections 31b are electrically connected to one of the signal layers 11, and both the two second pin sections 35b are electrically connected to another of the signal layers 11.

In use, a high-frequency electronic communication signal (e.g., a differential signal) transmitted through the signal layers 11 of the circuit board 10 is received by the first pin sections 31b, and reaches the first conducting vias 32 via the first circular pads 31a. A first portion of the signal is transmitted to the output pins 35 via the first conducting vias 32, and is also output via the second pin sections 35b. A second portion of the signal is transmitted to the first resistor R1 via the first connection element 36, and is reflected back to the output pins 35 by the first resistor R1. Thus, the second portion of the signal is output from the second pin sections 35b to enhance the first portion of the signal, and the output of the equalizer 100 obtains one stage of compensation. A third portion of the signal is transmitted to the second resistor R2 via the first connection element 36, the second conducting vias 33, the second connection elements 37, and the third conducting vias 34, and is reflected back to the output pins 35 by the second resistor R2. Thus, the third portion of the signal is output from the second pin sections 35b to also enhance the first portion of the signal, and the output of the equalizer 100 is given a second stage of compensation. In this way, transmission losses of the signal can be effectively compensated.

Figure 3:
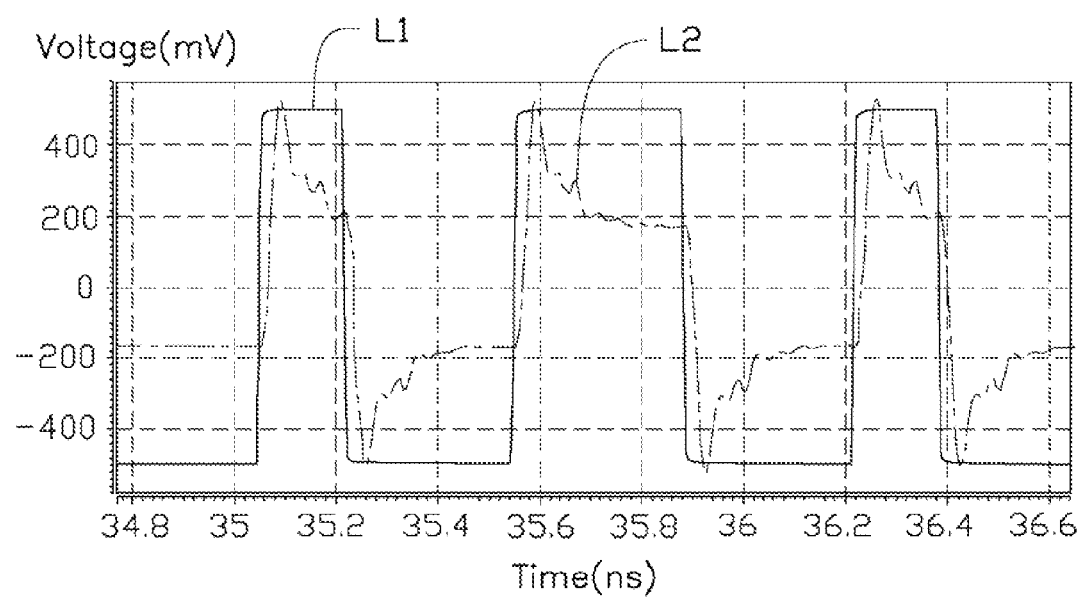
FIG. 3 is a comparison between a wave shape of a signal that has not been processed by the equalizer shown in FIG. 1 and a wave shape of the signal that has been processed by the equalizer shown in FIG. 1.

FIG. 3 is a comparison between a wave shape of a signal (e.g., a high-frequency electronic communication signal) that has not been processed by the equalizer 100 and a wave shape of the signal that has been processed by the equalizer 100. As shown in FIG. 3, the curve L1 shows the wave shape of the signal that has not been processed by the equalizer 100, and the curve L2 shows the wave shape of the signal that has been processed by the equalizer 100. According to related art, in each of the curves L1 and L2, flat portions represent low-frequency portions of the signal, and ascending and descending portions represent high-frequency portions of the signal. The curve L2 has more ascending and descending portions than the curve L1, that is, the signal which has been processed by the equalizer 100 has more high-frequency portions than the signal which has not been processed by the equalizer 100. Therefore, the equalizer 100 provides adequate compensation for high-frequency portions of electronic communication signals.

Figure 4:
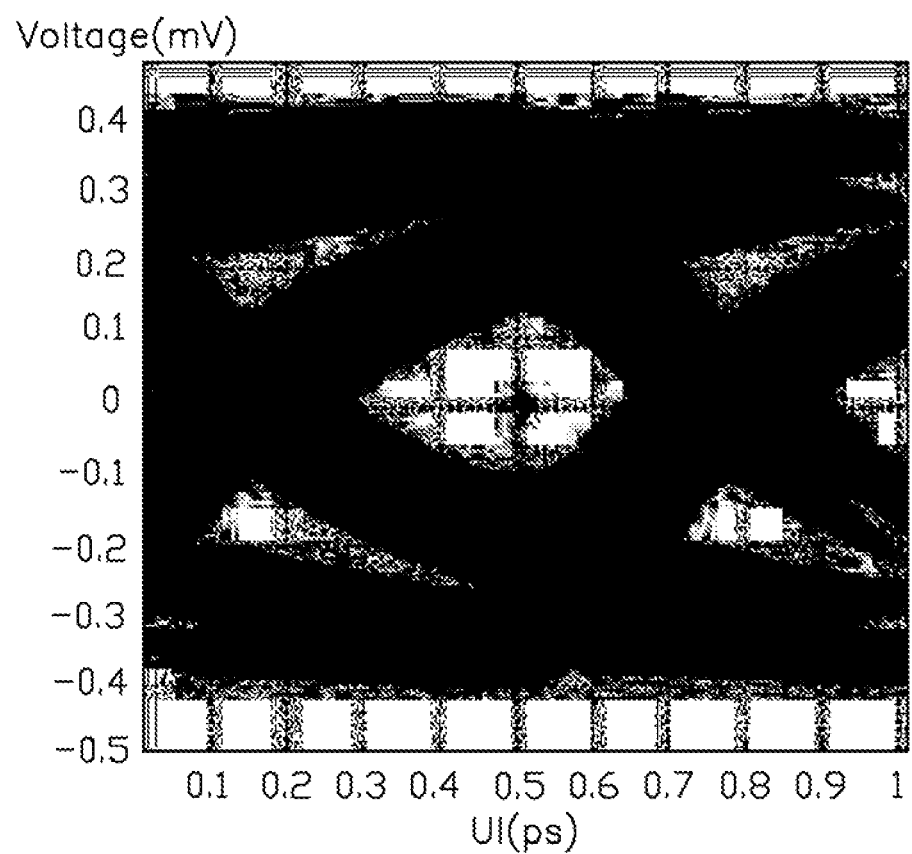
FIG. 4 is an eye diagram of the signal that has not been processed by the equalizer shown in FIG. 1 and has the wave shape shown in FIG. 3.
Figure 5:
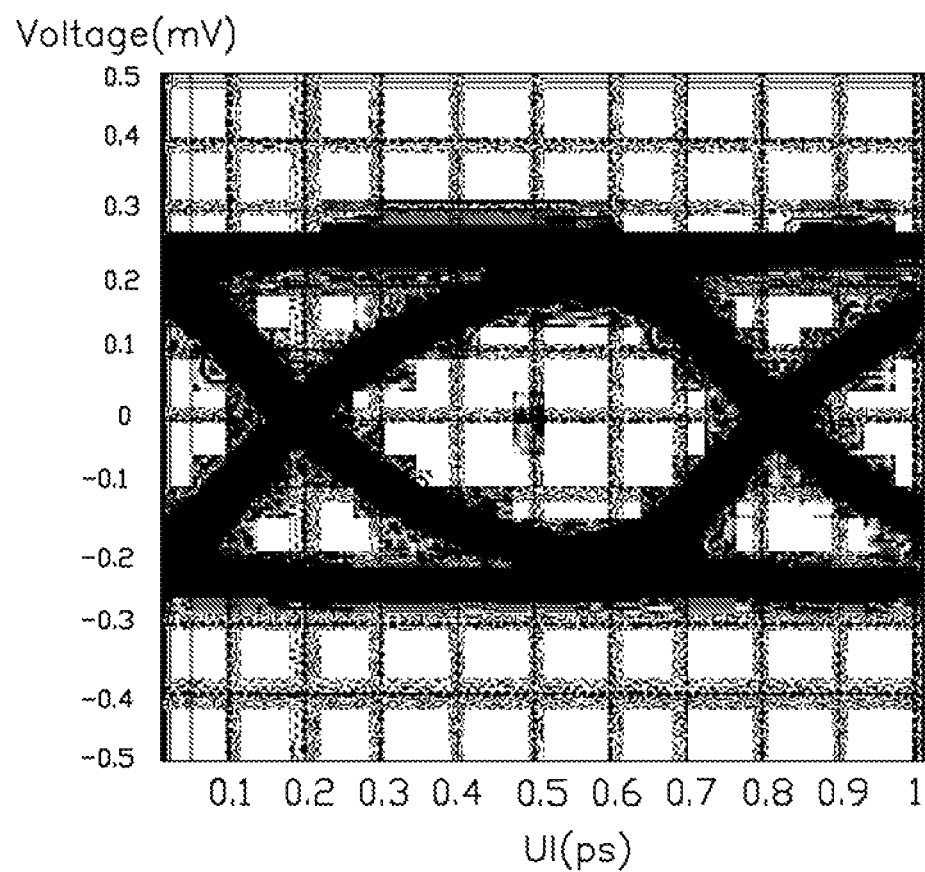
FIG. 5 is an eye diagram of the signal that has been processed by the equalizer shown in FIG. 1 and has the wave shape shown in FIG. 3.

FIG. 4 is an eye diagram of the above-described signal that has not been processed by the equalizer 100, and FIG. 5 is an eye diagram of the above-described signal that has been processed by the equalizer 100. In this embodiment, a resistance of the first resistor R1 is about 100 ohms, and a resistance of the second resistor R2 is about 33 ohms On this condition, the eye diagram of the signal that has not been processed by the equalizer 100 has larger undulations and a less height of the eye, and the eye diagram of the signal that has been processed by the equalizer 100 has less undulations and a greater eye height. According to related art, communication quality of the signal that has been processed by the equalizer 100 is better than that of the signal that has not been processed by the equalizer 100. Therefore, the equalizer 100 can significantly improve electronic communication quality.

As detailed above, when electronic communication signals pass through the equalizer 100, the equalizer 100 provides two stages of compensation to the electronic communication signals. Compared with typical equalizers, the equalizer 100 provides more compensation for the electronic communication signals. In other embodiments, the equalizer 100 can include more conducting vias and resistors electrically connected in series, and each electronic communication signal passing through the equalizer 100 can be processed more than twice according to the aforementioned method.

It is to be further understood that even though numerous characteristics and advantages of the present embodiments have been set forth in the foregoing description, together with details of structures and functions of various embodiments, the disclosure is illustrative only, and changes may be made in detail, especially in matters of arrangement of parts within the principles of the present invention to the full extent indicated by the broad general meaning of the terms in which the appended claims are expressed.

What is claimed is:

1. An equalizer for compensating transmission loss of electronic communication signals, comprising:
    a circuit board configured to transmit electronic communication signals; and
    a compensation module mounted on and electrically connected to the circuit board;
    wherein the compensation module includes a pair of input pins, a pair of output pins, and at least two resistors; the pair of output pins electrically connected to the pair of input pins, a first resistor of the at least two resistors electrically connected to the pair of input pins and the pair of output pins, and a second resistor of the at least two resistors electrically connected to the first resistor; and
    wherein when an electronic communication signal transmitted by the circuit board is received by the input pins, a first portion of the electronic communication signal is directly output from the output pins, a second portion of the electronic communication signal is reflected by the first resistor and transmitted back to the output pins to output, and a third portion of the electronic communication signal is reflected by the second resistor and transmitted back to the output pins to output.

2. The equalizer of claim 1, wherein the circuit board includes at least two signal layers and at least two grounding layers positioned alternately, and the at least two signal layers are configured to transmit electronic communication signals.

3. The equalizer of claim 2, wherein the input pins are electrically connected to one of the signal layers, and the output pins are electrically connected to another of the signal layers.

4. The equalizer of claim 1, wherein the compensation module further includes a pair of first conducting vias, a pair of second conducting vias, and a pair of third conducting vias; and
    wherein the input pins are electrically connected to the output pins via the first conducting vias, the first resistor is electrically connected to the input pins and the output pins via the first conducting vias, and the second resistor is electrically connected to the first resistor via the second conducting vias and the third conducting vias.

5. The equalizer of claim 4, wherein each of the pair of first conducting vias, the pair of second conducting vias, and the pair of third conducting vias is a hollow cylinder; and
    wherein the pair of first conducting vias are electrically connected to the pair of second conducting vias, and the pair of second conducting vias are electrically connected to the third conducting vias.

6. The equalizer of claim 5, wherein each of the pair of second conducting vias has an end secured on and electrically connected to the first resistor, and each of the pair of third conducting vias has an end secured on and electrically connected to the second resistor.

7. The equalizer of claim 6, wherein each of the pair of input pins is a planar sheet and includes a first circular pad and a first pin section, the first circular pad is a flat loop, and the first pin section is a longitudinal strip; an end of the first pin section is connected to the first circular pad, and the first circular pad and the first pin section are coplanar; the first circular pad of each input pin is mounted on a top end of one of the first conducting vias and is electrically connected to the first conducting via, and a central hole of the first circular pad is aligned with a central hole of the first conducting via.

8. The equalizer of claim 7, wherein the pair of input pins are positioned coplanar, and the first pin sections of the pair of input pins extend parallel to each other.

9. The equalizer of claim 8, wherein each of the pair of output pins is a planar sheet and includes a second circular pad and a second pin section, the second circular pad is a flat loop, and the second pin section is a longitudinal strip; an end of the second pin section is connected to the second circular pad, and the second circular pad and the second pin section are coplanar; the second circular pad of each input pin is coiled on a middle portion of one of the first conducting vias and is electrically connected to the first conducting via, and a central hole of the second circular pad is aligned with a central hole of the first conducting via.

10. The equalizer of claim 9, wherein the pair of output pins are positioned coplanar, a plane in which the two output pins are positioned is parallel to a plane in which the two input pins are positioned; and the second pin sections of the pair of output pins extend parallel to each other.

11. The equalizer of claim 10, wherein the compensation module further includes a pair of first connection elements and a pair of second connection elements, the second conducting vias are electrically connected to the first conducting vias via the first connection elements, and the third conducting vias are electrically connected to the second conducting vias via the second connection elements.

12. The equalizer of claim 11, wherein each first connection element includes a retaining pad, a first connection section, and a third circular pad; the retaining pad, the first connection section, and the third circular pad are all planar sheets and are positioned to be coplanar; and the first connection connects the retaining pad with the third circular pad.

13. The equalizer of claim 12, wherein the retaining pad of each first connection element is mounted on and electrically connected to the first resistor, and contacts and is electrically connected to a bottom end of one of the second conducting vias; and the third circular pad of each first connection element is coiled on a bottom end of one of the first conducting via to electrically connect the one of the second conducting vias to the one of the first conducting vias.

14. The equalizer of claim 13, wherein the pair of first connection elements are positioned to be coplanar, and a plane in which the pair of first connection elements are positioned is parallel to the plane in which the pair of output pins are positioned and the plane in which the pair of input pins are positioned.

15. The equalizer of claim 14, wherein each second connection element includes a fourth circular pad, a second connection section, and a fifth circular pad; the fourth circular pad, the second connection section, and fifth circular pad are all planar sheets and are all positioned to be coplanar with the input pins; and the second connection section connects the fourth circular pad with the fifth circular pad.

16. The equalizer of claim 15, wherein the fourth circular pad of each second connection element is mounted on and electrically connected to a top end of one of the second conducting vias, and the fifth circular pad of each second connection element is mounted on and electrically connected to one of the third conducting via, such that the one of the second conducting vias is electrically connected to the one of the third conducting vias.

17. The equalizer of claim 6, wherein the circuit board defines at least three assembly vias, and each of the at least three assembly vias runs through all of the signal layers and the grounding layers; and wherein the first conducting vias are received in a first one of the assembly vias, the second conducting vias and the first resistor are received in a second one of the assembly vias, and the third conducting vias and the second resistor are received in a third one of the assembly vias.

\* \* \* \* \*